Figure 1:
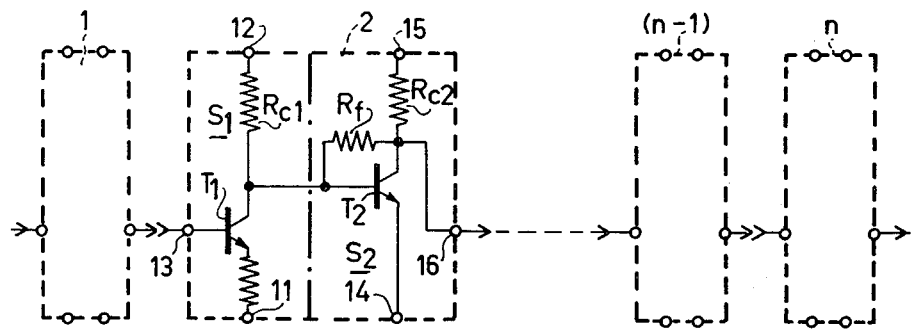

United States Patent [19]
Roza et al.

[11] 3,986,133
[45] Oct. 12, 1976

[54] WIDE-BAND TRANSISTOR AMPLIFIER

[75] Inventors: Engel Roza; Peter Wilhelm Millenaar, both of Eindhoven, Netherlands

[73] Assignee: U.S. Philips Corporation, New York, N.Y.

[22] Filed: Nov. 5, 1975

[21] Appl. No.: 628,910

[30] Foreign Application Priority Data
Jan. 27, 1975  Netherlands............... 7500898

[52] U.S. Cl.................... 330/18; 330/19; 330/22; 330/28
[51] Int. Cl.²........................... H03F 3/42
[58] Field of Search............ 330/18, 19, 22, 28, 330/38 M, 40, 71, 107

[56] References Cited
UNITED STATES PATENTS
3,900,800  2/1952  Maltz.................. 330/18 X Primary Examiner—James B. Mullins
Attorney, Agent, or Firm—Frank R. Trifari; George B. Berka

[57] ABSTRACT

In a wide-band transistor amplifier having a cascade arrangement of several of a special type of gain cell a low dissipation, a relatively small number of coupling and decoupling elements and a high value of gain-bandwidth product is obtained by interconnecting the gain cells in a special way. This wide-band amplifier is quite suited for monolithic integration and for construction as a distributed equalizing amplifier.

3 Claims, 6 Drawing Figures

WIDE-BAND TRANSISTOR AMPLIFIER

The invention relates to a wide-band transistor amplifier whose total gain is distributed over a number of cascade-connected gain cells, each gain cell comprising a first current series-feedback transistor stage and a second voltage shunt-feedback transistor stage, said first transistor stage being arranged as a common-emitter stage having an emitter-collector path between a first emitter supply terminal and a first collector supply terminal including an emitter resistor and a collector resistor, the base of said first transistor constituting a signal input of the gain cell, said second transistor stage also being arranged as a common-emitter stage having an emitter-collector path between a second emitter supply terminal and a second collector supply terminal including a collector resistor, the base of said second transistor being connected to the collector of said first transistor, the collector and the base of said second transistor being interconnected through a feedback resistor, the collector of said second transistor constituting a signal output of the gain cell coupled with the signal input of the next gain cell. Such wide-band amplifiers may be used for general purposes, for example, in repeaters in systems for the transmission of analog or digital signals through coaxial cables, in read amplifiers in systems for magnetic recording of signals, as antenna signal amplifiers, and as oscilloscope amplifiers.

If an amplifier having a large gain factor is to be realized for signals having a large bandwidth, an amplifier is preferably used whose gain is distributed over a number of cascade-connected stages each having their own feedback. This distribution has inter alia the advantage that the feedback is simpler and, especially at high frequencies, is more stable than in a multistage amplifier having a single feedback circuit for the entire amplifier.

The wide-band transistor amplifier defined in the preamble utilizes gain cell of a known type described by Cherry, E. M. and Hooper, M. E. in "The design of wide-band transistor feedback amplifiers", Proc. IEE, Vol. 110, No. 2, February 1963, pp. 375–389. This type of gain cell has a high input impedance and a low output impedance so that the gain cells can be connected in cascade without any noticeable interaction. In addition this type of gain cell is distinguished by its high gain-bandwidth product, the gain and bandwidth being insensitive to transistor parameter variations, and large output voltages may be obtained.

To obtain large gain factors over a wide frequency band, however, a comparatively large number of gain cells is required so that the dissipation in such an amplifier is high. In addition, the frequency response of such an amplifier is detrimentally influenced by the large number of coupling and decoupling elements.

It is an object of the invention to provide a wide-band transistor amplifier of the kind described in the preamble in which a high value of gain-bandwidth product is accompanied by a low dissipation and a small number of coupling and decoupling elements, which amplifier is suited for monolithic integration and is furthermore quite suited to be designed as a distributed equalizing amplifier in which both the gain and the equalization is distributed over the cascade-connected gain cells.

The wide-band transistor amplifier according to the invention is characterized in that the emitter-collector paths of said second transistor stages in consecutive gain cells form part of a first supply current path and the emitter-collector paths of said first stages in consecutive gain cells alternately form part of a second supply current path and a third supply current path, all said supply current paths being coupled with a first common supply terminal connected through resistors to said second and first emitter supply terminals of the first gain cell and to said first emitter supply terminal of the second gain cell, all said supply current paths also being coupled with a second common supply terminal connected directly to said first and second collector supply terminals of the last gain cell and connected through a resistor to said first collector supply terminal of the penultimate gain cell, said first supply current path further being coupled with said second and third supply current paths through current distribution resistors connected between said second emitter supply terminal of a gain cell and said first emitter supply terminal of the next gain cell as well as between said second emitter supply terminal of the last gain cell and said first collector supply terminal of the penultimate gain cell, said first and second emitter supply terminals of all gain cells constituting contact points for connecting these terminals through capacitors to a point of reference potential, said signal input of the first gain cell being connected to a tap on said resistor connecting said second emitter supply terminal of this first gain cell to said first common supply terminal.

The invention and its advantages will now be described with reference to the Figures.

Figure 2:
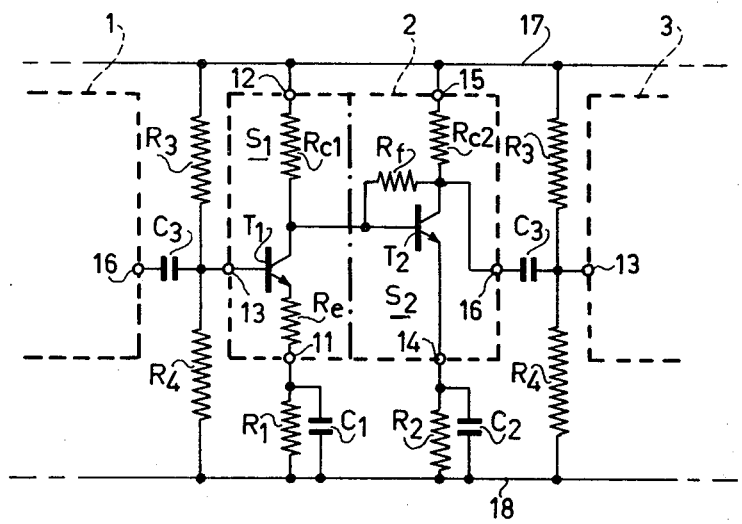
Figure 3:
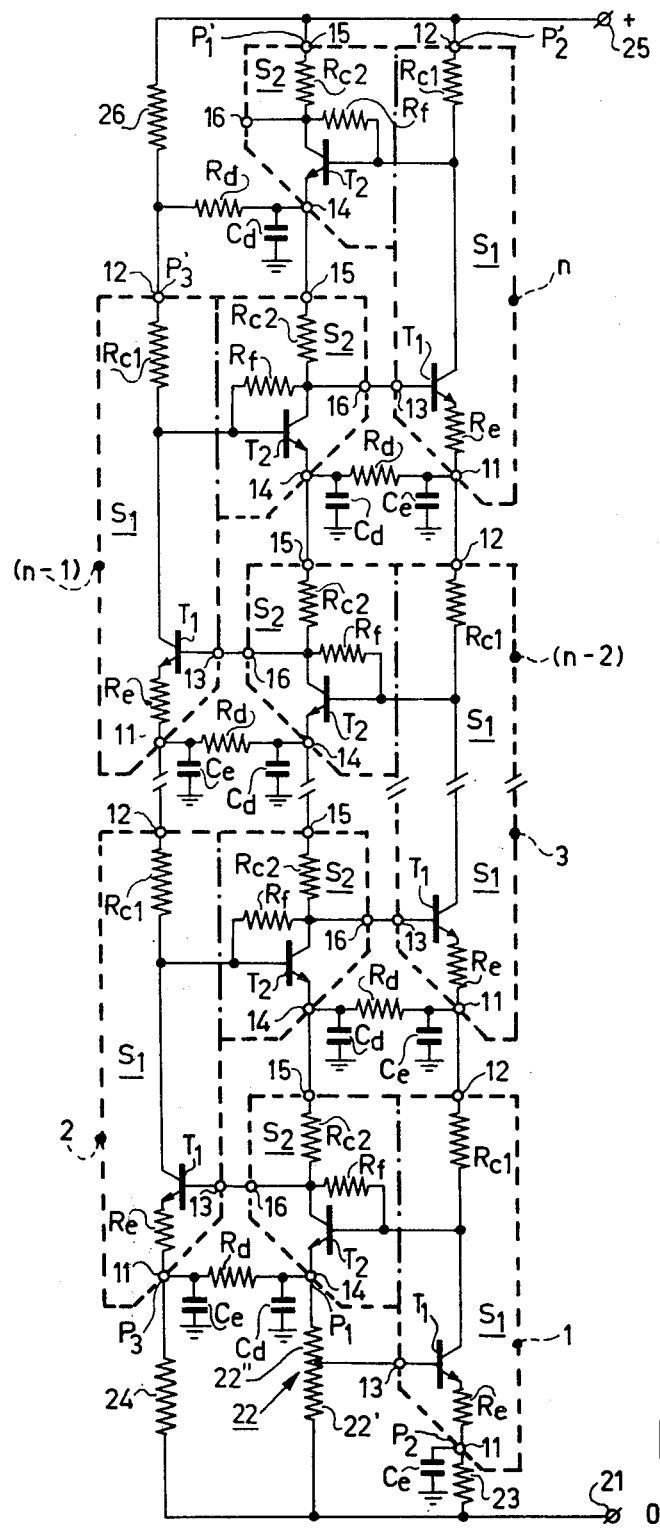
Figure 4:
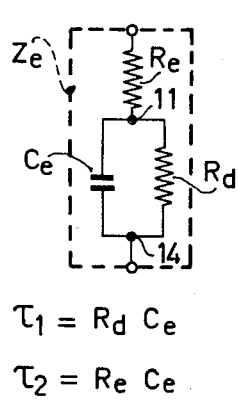
Figure 5:
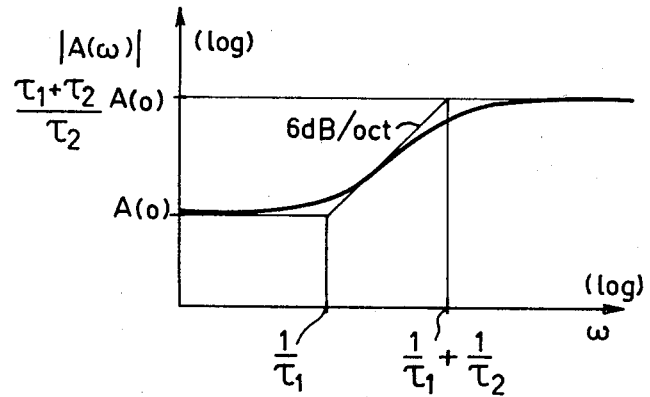
Figure 6:
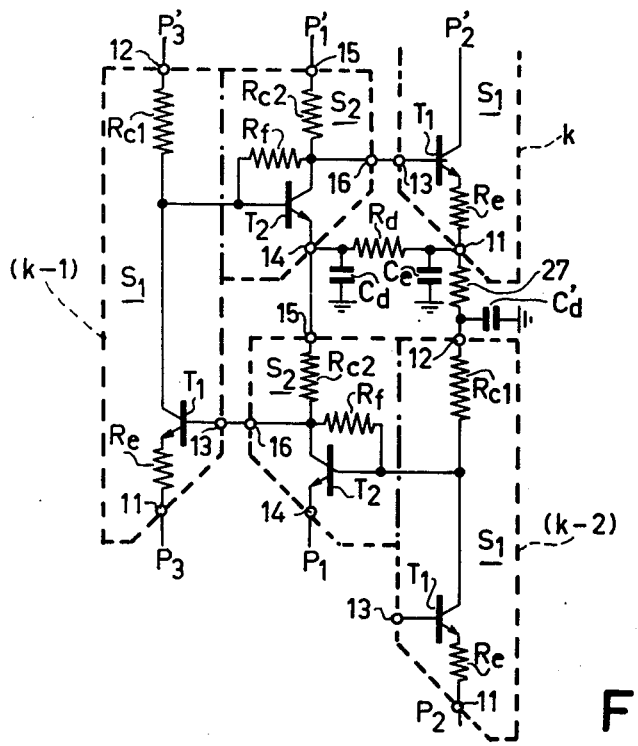

FIG. 1 shows the basic circuit diagram of a wide-band transistor amplifier with a known type of gain cell used therein, FIG. 2 shows in greater detail a known method of connecting a gain cell in FIG. 1, FIG. 3 shows a complete circuit diagram of a wide-band transistor amplifier according to the invention, FIG. 4 shows a circuit diagram and FIG. 5 a frequency diagram for explaining the operation of the wide-band amplifier in FIG. 3 if formed as an equalizing amplifier, FIG. 6 shows a circuit diagram of a modification of the wide-band amplifier of FIG. 3 if formed as an equalizing amplifier.

FIG. 1 shows the basic circuit diagram of a wide-band transistor amplifier whose total gain is distributed over a cascade arrangement of identical gain cells 1, 2, . . . , (n−1), n. As is shown in FIG. 1 for gain cell 2, each gain cell comprises a first transistor stage $S_1$ having current series-feedback and a following second transistor stage $S_2$ having voltage shunt-feedback. The first stage $S_1$ comprises a transistor $T_1$ in common-emitter configuration and has an emitter-collector path between a first emitter supply terminal 11 and a first collector supply terminal 12 including an emitter resistor $R_e$ and a collector resistor $R_{c1}$. The base of transistor $T_1$ constitutes the signal input 13 of the gain cell. The second stage $S_2$ comprises a transistor $T_2$ likewise in common-emitter configuration and has an emitter-collector path between a second emitter supply terminal 14 and a second collector supply terminal 15 including a collector resistor $R_{c2}$. The base of transistor $T_2$ is connected to the collector of transistor $T_1$, the collector and the base of transistor $T_2$ are interconnected through a feedback resistor $R_f$ and the collector of transistor $T_2$ constitutes the signal output 16 of the cell which is coupled with the signal input 13 of the next cell.

FIG. 2 shows in greater detail how gain cell 2 of FIG. 1 is connected in known manner to the adjacent gain cells 1, 3 and the voltage supply leads.

In FIG. 2 the supply currents of the two transistor stages $S_1$, $S_2$ of all gain cells 1, ..., n are arranged in parallel. To this end the two collector supply terminals 12, 15 in each gain cell are connected directly to a common supply lead 17, while the first and second emitter supply points 11, 14 in each gain cell are connected to a common supply lead 18 through resistors $R_1$, $R_2$ shunted by decoupling capacitors $C_1$, $C_2$, respectively. Furthermore the signal output 16 of a gain cell and the signal input 13 of the next gain cell are connected together through a coupling capacitor $C_3$ because direct interconnection is impossible in view of the level shift between input 13 and output 16 of each gain cell. This level shift is equal to the sum of the collector swings of the transistors $T_1$ and $T_2$, which collector swings must be sufficiently large to reduce the distortion with large signals and the unwanted influence of the collector-base capacitance on the frequency response. In order to obtain in this case the correct current bias for transistor $T_1$, the base of transistor $T_1$ is also connected through two resistors $R_3$ and $R_4$ to the supply leads 17 and 18.

If the gain cells each comprising two transistors $T_1$, $T_2$ and four resistors $R_e$, $R_{c1}$, $R_{c2}$, $R_f$ are connected in the manner shown in FIG. 2. four extra resistors $R_1$, $R_2$, $R_3$, $R_4$ and three extra capacitors $C_1$, $C_2$, $C_3$ are required for each gain cell. This proportionally large number of additional elements for each gain cell contributes to a considerable extent to the total dissipation in th wideband amplifier and moreover has a detrimental influence on its frequency response.

In the wide-band transistor amplifier shown in FIG. 3 a considerable economy in the number of additional elements per gain cell is obtained in that, according to the invention, the emitter-collector paths 14–15 of the second transistor stages $S_2$ in consecutive gain cells 1, 2, ..., n form part of a first supply current path $P_1$-$P'_1$ and the emitter-collector paths 11–12 of the first transistor stages $S_1$ in consecutive gain cells 1, 2, ..., n alternately form part of a second supply current path $P_2$-$P'_2$ and a third supply current path $P_3$-$P'_3$; in FIG. 3 the number n of the gain cells is assumed to be odd and the second supply current path $P_2$-$P'_2$ comprises the emitter-collector paths 11–12 of the first stages $S_1$ of the gain cells 1, 3, .., (n−2), n and the third supply current path $P_3$-$P'_3$ comprises those of the gain cells 2, 4, ..., (n−1). All supply current paths are coupled with a first common supply terminal 21 which is connected through resistors 22, 23, 24 to the second and first emitter supply terminals 14 and 11 of gain cell 1 and the first emitter supply terminal 11 of gain cell 2, respectively. All supply current paths are also coupled with a second common supply terminal 25 which is directly connected to the first and second collector supply terminals 12 and 15 of gain cell n and through a resistor 26 to the first collector supply terminal 12 of gain cell (n−1). In addition the first supply current path $P_1$-$P'_1$ is coupled with the second and third supply current paths $P_2$-$P'_2$, $P_3$-$P'_3$ through current distribution resistors $R_d$ which are connected between the second emitter supply terminal 14 of a gain cell and the first emitter supply terminal 11 of the next gain cell and between the second emitter supply terminal 14 of gain cell n and the first collector supply terminal 12 of gain cell (n−1). The first and second emitter supply terminals 11 and 14 of all gain cells also constitute contact points for connecting these supply terminals to a point of reference potential (earth or ground) through capacitors $C_e$ and $C_d$. The signal input of the wide-band amplifier in FIG. 3 is constituted by signal input 13 of gain cell 1 which is connected to a tap on resistor 22 between the second emitter supply terminal 14, of this gain cell 1 and the first common supply terminal 21. Furthermore the signal output 16 of each gain cell is directly connected to the signal input 13 of the next gain cell, the signal output of the wide-band amplifier in FIG. 3 being constituted by signal output 16 of gain cell n.

The advantages achieved by incorporating the steps according to the invention will now be described further.

By connecting the gain cells in the manner shown in FIG. 3, the supply current paths of the second transistor stages $S_2$ of all gain cells 1, 2, ..., (n−1), n are arranged in series, as are the supply current paths of the first transistor stages $S_1$ of the gain cells 1, 3, .., (n−2), n and those of the gain cells 2, 4, ..., (n−3), (n−1). The value of the supply currents in each of these paths $P_1$-$P'_1$, $P_2$-$P'_2$, $P_3$-$P'_3$ is determined with the aid of resistors 22, 23, 24, 26 and the position of the tap on resistor 22.

The incorporation of this first step results in a considerable economy in the number of additional elements in each gain cell. In the first place the function of the bias resistors $R_1$, $R_2$ in FIG. 2 can be fulfilled by the transistor stages $S_1$, $S_2$ of the two previous gain cells, i.e. the role of resistor $R_1$ for gain cell k can be taken over by the first stage $S_1$ of gain cell (k−2) and the role of resistor $R_2$ can be taken over by the second stage $S_2$ of gain cell (k−1). In the second place the coupling capacitor $C_3$ and hence the bias resistors $R_3$, $R_4$ in FIG. 2 can be omitted. In fact, the type of gain cell used makes it possible to vary the values of the collector resistors $R_{c1}$, $R_{c2}$ within wide limits while maintaining the gain factor constant. This freedom in the choice of the resistors $R_{c1}$, $R_{c2}$ is utilized in FIG. 3 to make the supply voltage drop across the first stage $S_1$ of each of the gain cells 1, .., (n−2) larger than that across the second stage $S_2$ thereof and this by such an amount that the level shift of the signal between input 13 and output 16 of each of the gain cells 2, ..., (n−1) is accompanied by the same shift of the bias level at the input 13 of each of the next gain cells 3, ..., n, while still maintaining the correct bias current for the transistors $T_1$, $T_2$.

In order to obtain the correct bias currents and the correct bias levels only five additional resistors are required in the entire wide-band amplifier of FIG. 3: the two parts 22', 22" of resistor 22 whose total value determines the supply current in the first path $P_1$-$P'_1$, the resistor 23 whose value together with the ratio between the two part-resistors 22', 22" determines the supply current in the second path $P_2$-$P'_2$ and the resistors 24, 26 whose joint value determines the supply current in the third path $P_3$-$P'_3$, the value of resistor 24 being also chosen to be such that the bias level at input 13 of gain cell 2 exactly corresponds to the level at output 16 of gain cell 1. To obtain the correct bias levels at the inputs 13 of the gain cells 3, ..., n no additional resistors are necessary because in gain cell 1 the value of resistor $R_{c1}$ can be chosen to be larger than that of resistor $R_{c2}$ by such an amount that the bias level at input 13 of gan cell 3 corresponds to the level at output 16 of gain cell 2, and the same procedure can be followed for the gain cells 2, . . . (n—2) as for gain cell 1.

In contradistinction to FIG. 2 in which four additional bias resistors $R_1$, $R_2$, $R_3$, $R_4$, a coupling capacitor $C_3$ and two decoupling capacitors $C_1$, $C_2$ are required for each gain cell, the wide-band amplifier of FIG. 3 only requires two decoupling capacitors $C_e$, $C_d$ for each gain cell and five additional bias resistors 22', 22", 23, 24, 26 for the entire amplifier. The incorporation of the first step described above thus results in a considerable reduction of the total dissipation in the wide-band amplifier and in addition has a favourable influence on its frequency response due to the absence of coupling capacitors between the gain cells.

However, if only this first step were incorporated it would be difficult to obtain satisfactory approximations to the desired bias levels and the desired bias currents simultaneously for all gain cells of the wide-band amplifier, particularly if their number were comparatively large. In fact, in each gain cell the emitter-collector paths 11–12, 14–15 of the two transistor stages $S_1$, $S_2$ are coupled together through the feedback resistor $R_f$ between collector and base of transistor $T_2$. Consequently, when each signal output 16 is directly connected to the signal input 13 of the next gain cell the freedom which remains in the choice of supply currents and resistors for the paths $P_1$-$P_1'$, $P_2$-$P_2'$, $P_3$-$P_3'$ is insufficient to enable the same emitter direct current to be obtained for all transistors $T_1$, $T_2$. As a result the dissipation will be unevenly distributed over the various transistor stages $S_1$, $S_2$ and moreover the frequency response of the wide-band amplifier will be detrimentally influenced because the current gain-bandwidth product $f_T$ of the transistors $T_1$, $T_2$ and hence the gain-bandwidth product of the stages $S_1$, $S_2$ depends on the emitter direct current, $f_T$ exhibiting an optimum for a particular value of this current.

These drawbacks are obviated in FIG. 3 by providing the current distribution resistors $R_d$ which are chosen to be such that for each gain cell the direct current which flows out of the first supply current path $P_1$-$P_1'$ through the resistor $R_f$ is compensated for by the direct current which flows into the first supply current path $P_1$-$P_1'$ through the resistor $R_d$.

As a result of incorporating this second step all transistors in a supply current path carry substantially the same emitter direct current, and this current can in addition be made substantially equal to the value required to give an optimum current gain-bandwidth product $f_T$ for all supply current paths by suitably choosing the bias resistors 22', 22", 23, 24, 26. This also makes it easier to obtain the desired bias levels.

The incorporation of this second step thus gives a substantially uniform distribution of the dissipation over the various transistor stages and furthermore has a favourable influence on the frequency response because the optimum value of the current gain-bandwidth product can be obtained for all transistors. The increase in the total dissipation resulting from taking this second step is very low because in practice the direct current in the resistor $R_f$ is low with respect to the direct current in the supply current paths, so that the same applies to the direct current in the resistor $R_d$. Thus, in practice, incorporating this second step has hardly any influence on the considerable reduction of the total dissipation achieved by incorporating the first step.

In this manner the use of the steps according to the invention results in a wide-band transistor amplifier which is distinguished by a very low dissipation, a small number of coupling and decoupling elements per gain cell and a high value of the gain-bandwidth product. Furthermore this wide-band amplifier is eminently suitable for integration in one semiconductor body, inter alia because the gain and bandwidth in the type of gain/cell used are not very sensitive to transistor parameter variations. It depends on the specific use of such a monolithic integrated circuit whether the decoupling capacitors are accommodated in the semiconductor body or whether it is provide to proide contact points for external decoupling capacitors.

In some applications a wide-band amplifier is used in combination with an equalizer. This is the case, for example, in regenerative repeaters in systems for the transmission of digital signals through coaxial cables in which the amplitude and phase characteristics of the cable section preceding the regenerative repeater have to be equalized. If in such applications the equalizer is placed before the wide-band amplifier, the influence of the amplifier noise on the signal-to-noise ratio at the output of the combination is large. If on the other hand the equalizer is placed after the wide-band amplifier, the dynamic range at the output of the amplifier has to be very large, which is accompanied by a large dissipation. For such applications a distributed equalizing amplifier is preferred in which both the equalization and the amplification is distributed over a number of cascade-connected stages because the influence of the amplifier noise on the signal-to-noise ratio at the output is then as small as possible, and the dynamic range at the output can remain small so that the dissipation can also be maintained at a low level.

The present wide-band transistor amplifier is eminently suited for such a purpose, because the gain factor A of a gain cell can be made frequency-dependent in a simple manner by choosing the value of the corresponding capacitor $C_e$ in FIG. 3 to be relatively small with respect to that of the corresponding decoupling capacitor $C_d$.

This can be shown as follows. If $C_e$ and $C_d$ are both decoupling capacitors, the gain factor A of a gain cell is given to a satisfactory approximation by the relation:

$$A = R'_f/R_e \qquad (1)$$

in which $R'_f$ is the resistance of the parallel arrangement of collector resistor $R_{c2}$ and feedback resistor $R_f$ in stage $S_2$ and $R_e$ is the resistance of the emitter resistor in stage $S_1$, provided that $R_f$ is small with respect to the quotient of the current gain and the transconductance of transistor $T_2$. For a prescribed value of A the choice of $R_{c2}$ is determined by a practical compromise between that which would give the lowest possibe dissipation, which implies a low value of $R_{c2}$, and that which would give a gain which depends as little as possible on the transistor parameters, which involves a large feedback factor and hence a high value of $R_{c2}$.

If the emitter resistor $R_e$ is replaced by a complex impedance $Z_e$, the gain factor A becomes frequency-dependent. In the case considered $C_e$ is small with respect to $C_d$ so that this impedance $Z_e$ is constituted by $R_e$ in series with the parallel arrangement of $R_d$ and $C_e$, because decoupling capacitor $C_d$ connects one end of $R_d$ for substantially all frequencies to a point of reference potential. Thus $Z_e$ has the form shown in FIG. 4 and is defined by the relation:

$$Z_e(\omega) = R_e \frac{j\omega + 1/\tau_1 + 1/\tau_2}{j\omega + 1/\tau_1} \quad (2)$$

in which $$1/\tau_1 = 1 R_d C_e \quad (3)$$

$$1/\tau_1 + 1/\tau_2 = 1/R_d C_e + 1/R_e C_e$$

From formulas (1) and (2) the gain factor A as a function of frequency $\omega$ satisfies the relation $$A(\omega) = A(o) \cdot \frac{\tau_1 + \tau_2}{\tau_2} \cdot \frac{j\omega + 1/\tau_1}{j\omega + 1/\tau_1 + 1/\tau_2} \quad (4)$$

in which $$A(o) = R'_f / (R_e + R_d) \quad (5)$$

is the gain factor at $\omega = o$.

Formulas (3) and (4) show that $A(\omega)$ has a real zero and a real pole and that the frequency $\omega = 1/\tau_1$ associated with the zero is always lower than the frequency $\omega = 1/\tau_1 + 1/\tau_2$, associated with the pole. The variation of the absolute value $|A(\omega)|$ as a function of the frequency $\omega$ when $A(\omega)$ is given by formula (4) is represented in FIG. 5 using a logarithmic scale along both axes. As FIG. 5 shows, $|A(\omega)|$ as a function of $\omega$ is substantially constant and equal to $A(o)$ from $\omega = 0$ to the corner frequency $\omega = 1/\tau_1$ associated with the zero, it subsequently increasing monotonously up to the corner frequency $\omega = 1/\tau_1 + 1/\tau_2$ associated with the pole, after which it is again substantially constant and equal to $A(o) (\tau_1 + \tau_2)/\tau_2$ for higher frequencies. The asymptotes are also shown in FIG. 5 for completeness' sake.

In many practical applications of a distributed equalizing amplifier such a variation of the frequency-dependent gain of a gain cell is that which is required for the equalization. The required location of the two corner frequencies can be obtained by suitably choosing the values of $R_e$, $R_d$ and $C_e$ in each of the gain cells 2, ..., $n$ and of $R_e$, $C_e$ and resistor 23 in gain cell 1, which resistor 23 can fulfil the role of $R_d$ in the impedance $Z_e$ for gain cell 1. The values of $R_e$ and $R_d$ may be varied within wide limits for this purpose without noticeably influencing the bias levels and the bias currents even when it is required that the gain factor at zero frequency must remain substantially constant.

In some unfavourable circumstances the fact that $C_e$ is relatively small with respect to $C_d$ may give rise to difficulties as will be explained with reference to FIG. 6. In FIG. 6 an arbitrary section of FIG. 3 comprising three consecutive gain cells $(k-2)$, $(k-1)$ and $k$ is shown again.

The signal at the first emitter supply terminal 11 of gain cell $k$ in FIG. 6 is not equal to zero for all frequencies owing to the relatively low value of the capacitor $C_e$ connected to this terminal 11. As a result a small fraction of this signal also occurs at the base of transistor $T_2$ in gain cell $(k-2)$ which, similarly to gain cell $k$, has a first stage $S_1$ whose emitter-collector path 11-12 forms part of the second supply current path $P_2$-$P_2'$. This small signal fraction is amplified in transistor $T_2$ of gain cell $(k-2)$ and transistors $T_1$, $T_2$ of gain cell $(k-1)$, is subsequently passed on substantially unchanged from the base to the emitter of transistor $T_1$ in gain cell $k$ and is finally applied to the first emitter supply terminal 11 of gain cell $k$ after attenuation in the complex impedance $R_e$, $R_d$, $C_e$. In some cases the parasitic feedback loop thus formed might cause unwanted deviations in the frequency response.

In the feedback loop considered in FIG. 6 these difficulties are, however, obviated in a simple manner by including a resistor 27 in the second supply current path $P_2$-$P_2'$, which resistor is connected between the first collector supply terminal 12 of gain cell $(k-2)$ and the first emitter supply terminal 11 of gain cell $k$, and by furthermore connecting the first collector supply terminal 12 of gain cell $(k-2)$ through a decoupling capacitor $C'_d$ to a point of reference potential.

Taking this step results in an interruption of the parasitic feedback loop considered and thus eliminates the difficulty that might otherwise be caused by this loop. The value of resistor 27 is chosen to be such that the resistors 27 and $R_{c1}$ of gain cell $(k-2)$ combined give the desired shift of the bias level for gain cell $k$. Thus the total dissipation is no higher than in FIG. 3 in which resistor 27 is absent but in which collector resistor $R_{c1}$ has to have a much larger value than in FIG. 6 to obtain the correct bias level. In FIG. 6 it should be taken into account that, as regards the equalization, the current distribution resistor $R_d$ in the complex impedance $R_e$, $R_d$, $C_e$ and resistor 27 are in parallel.

The step incorporated in the circuit of FIG. 6 for the gain cells $(k-2)$ and $k$ which both have a first stage $S_1$ whose emitter-collector path 11-12 forms part of the second supply current path $P_2$-$P_2'$ is also incorporated mutatis mutandis in the circuit for the gain cells $(k-3)$ and $(k-1)$ which both have a first stage $S_1$ whose emitter-collector path 11-12 forms part of the third supply current path $P_3$-$P_3'$.

There are of course other ways of obtaining a frequency-dependent gain in the present wide-band amplifier. For example, if in FIG. 3 the feedback resistor $R_f$ is replaced by a complex impedanze $Z_f$ in the form of a parallel arrangement of a resistor and a capacitor, the gain for higher frequencies will be lower than that for lower frequencies, which is in contrast with the replacement of the emitter resistor $R_e$ by the impedance $Z_e$ described with reference to FIG. 4 and FIG. 5. If desired, these two possibilities may be combined. However, in practice the possibility shown in FIG. 4 will be the one most used, all the more because it does not necessitate the provision of additional elements.

What is claimed is:

1. A wide-band transistor amplifier whose total gain is distributed over a number of cascade-connected gain cells, each gain cell comprising a first current series-feedback transistor stage and a following second voltage shunt-feedback transistor stage, said first transistor stage being arranged as a common-emitter stage having an emitter-collector path between a first emitter supply terminal and a first collector supply terminal including an emitter resistor and a collector resistor, the base of said first transistor constituting a signal input of the gain cell, said second transistor stage also being arranged as a common-emitter stage having an emitter-collector path between a second emitter supply terminal and a second collector supply terminal including a collector resistor, the base of said second transistor being connected to the collector of said first transistor, the collector and the base of said second transistor being interconnected through a feedback resistor, the collector of said second transistor constituting a signal output of the gain cell coupled with the signal input of the next gain cell, characterized in that the emitter-collector paths of said second transistor stages in consecutive gain cells form part of a first supply current path and the emitter-collector paths of said first transistor stages in consecutive gain cells alternately form part of a second supply current path and a third supply current path, all said supply current paths being coupled with a first common supply terminal connected through resistors to said second and first emitter supply terminals of the first gain cell and to said first emitter supply terminal of the second gain cell, all said supply current paths also being coupled with a second common supply terminal connected directly to said first and second collector supply terminals of the last gain cell and connected through a resistor to said first collector supply terminal of the penultimate gain cell, said first supply current path further being coupled with said second and third supply current paths, through current distribution resistors connected between said second emitter supply terminal of a gain cell and said first emitter supply terminal of the next gain cell as well as between said second emitter supply terminal of the last gain cell and said first collector supply terminal of the penultimate gain cell, said first and second emitter supply terminals of all gain cells constituting contact points for connecting these terminals through capacitors to a point of reference potential, said signal input of the first gain cell being connected to a tap on said resistor connecting said second emitter supply terminal of this first gain cell to said first common supply terminal.

2. A wide-band transistor amplifier as claimed in claim 1, and arranged as an equalizing amplifier whose equalization is distributed over said cascade-connected gain cells, characterized in that said second emitter supply terminal of all gain cells is connected to said point of reference potential by a decoupling capacitor and said first emitter supply terminal of all gain cells is connected to said point of reference potential by a capacitor whose capacitance is small with respect to that of said decoupling capacitor, said capacitor co-operating with said current distribution and emitter resistors connected thereto so as to obtain gain cells having frequency-dependent gain.

3. A wide-band transistor amplifier as claimed in claim 2, characterized in that each of said second and third supply current paths comprises resistors connected between said first collector supply terminal of a gain cell and said first emitter supply terminal of the next gain cell in the relevant supply current path, said first collector supply terminals being connected to said point of reference potential by decoupling capacitors.

* * * * *

UNITED STATES PATENT AND TRADEMARK OFFICE
CERTIFICATE OF CORRECTION

PATENT NO. : 3,986,133
DATED : October 12, 1976
INVENTOR(S) : ENGEL ROZA ET AL

It is certified that error appears in the above-identified patent and that said Letters Patent are hereby corrected as shown below:

Column 4, line 67, "gan" should be --gain--.

Column 6, line 13, "provide to proide" should be --sufficient to provide--.

Signed and Sealed this fifth Day of July 1977

[SEAL]

Attest:

RUTH C. MASON
Attesting Officer

C. MARSHALL DANN
Commissioner of Patents and Trademarks